(12) United States Patent
Lowenhar et al.

(10) Patent No.: US 6,868,101 B1
(45) Date of Patent: Mar. 15, 2005

(54) LOW COST MEANS OF MODULATING A LASER

(75) Inventors: Herman C. Lowenhar, New York, NY (US); Burton L. Hulland, Long Beach, NY (US)

(73) Assignee: Kol Ohr Corporation, Wilmington, DE (US)

( * ) Notice: Subject to any disclaimer, the term of this patent is extended or adjusted under 35 U.S.C. 154(b) by 0 days.

(21) Appl. No.: 09/269,145

(22) PCT Filed: Sep. 12, 1997

(86) PCT No.: PCT/US97/17139

§ 371 (c)(1),
(2), (4) Date: Mar. 12, 1999

(87) PCT Pub. No.: WO98/11636

PCT Pub. Date: Mar. 19, 1998

Related U.S. Application Data

(60) Provisional application No. 60/029,733, filed on Oct. 23, 1996, and provisional application No. 60/026,255, filed on Sep. 13, 1996.

(51) Int. Cl.$^7$ .................................................. H01S 3/13
(52) U.S. Cl. ........................ 372/26; 372/45; 372/29.015
(58) Field of Search ............................. 372/92, 20, 32, 372/43

(56) References Cited

U.S. PATENT DOCUMENTS

| | | | | |
|---|---|---|---|---|
| 4,612,555 A | * | 9/1986 | Hongou et al. | 347/247 |
| 4,872,080 A | * | 10/1989 | Hentschel et al. | 361/57 |
| 5,007,062 A | * | 4/1991 | Chesnoy | 372/26 |
| 5,231,683 A | * | 7/1993 | Hockaday et al. | 385/49 |
| 5,315,436 A | * | 5/1994 | Lowenhar et al. | 359/569 |
| 5,337,323 A | * | 8/1994 | Rokugawa | 372/31 |
| 5,659,560 A | * | 8/1997 | Ouchi et al. | 372/27 |
| 5,724,164 A | * | 3/1998 | Lowenhar | 359/34 |

* cited by examiner

*Primary Examiner*—Don Wong
*Assistant Examiner*—Dung (Michael) Nguyen
(74) *Attorney, Agent, or Firm*—Darby & Darby

(57) ABSTRACT

The present invention discusses a modulation method and apparatus for modulating an extended-cavity laser (211). The method and apparatus (200–203) entails the use of each pulse in an input modulating pulse train as the trigger for the generation of a brief or "notch" pulse, i.e. a pulse that briefly diminishes the normal drive current. Each "notch" pulse is used to drive the semiconduct (211) embedded in an extended cavity with a current that flows opposite to its normal drive current. This serves to diminish the inverted charge-carrier population essential to lasing action, so the laser output falls sharply in a form of amplitude modulation. The invention also discloses a simple, miniaturized means (372, 352, 312) of micropositioning, based on the differential rotation of nested conical plugs, that can serve to couple the semiconductor laser to the cavity.

32 Claims, 16 Drawing Sheets

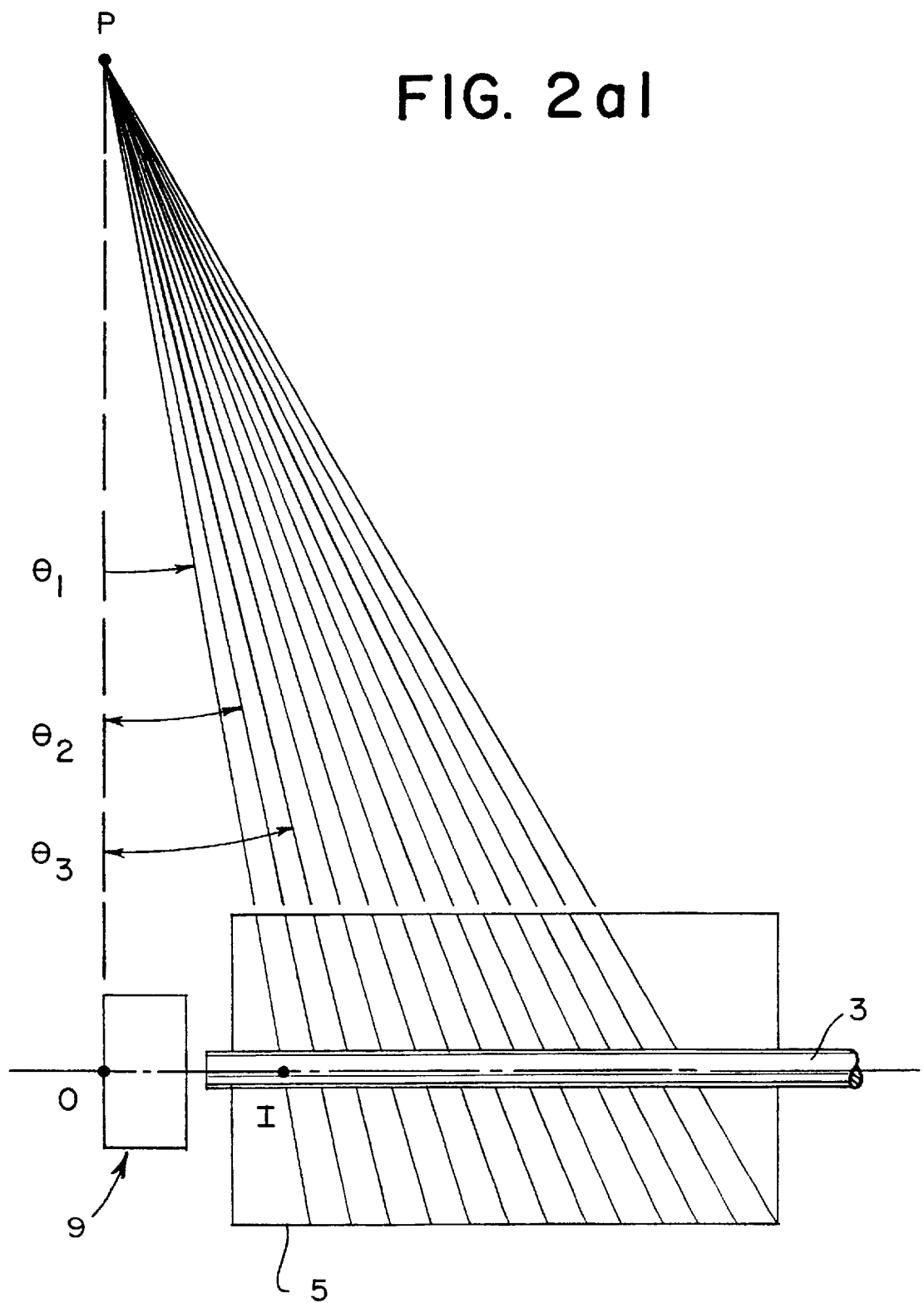
FIG. 2a1

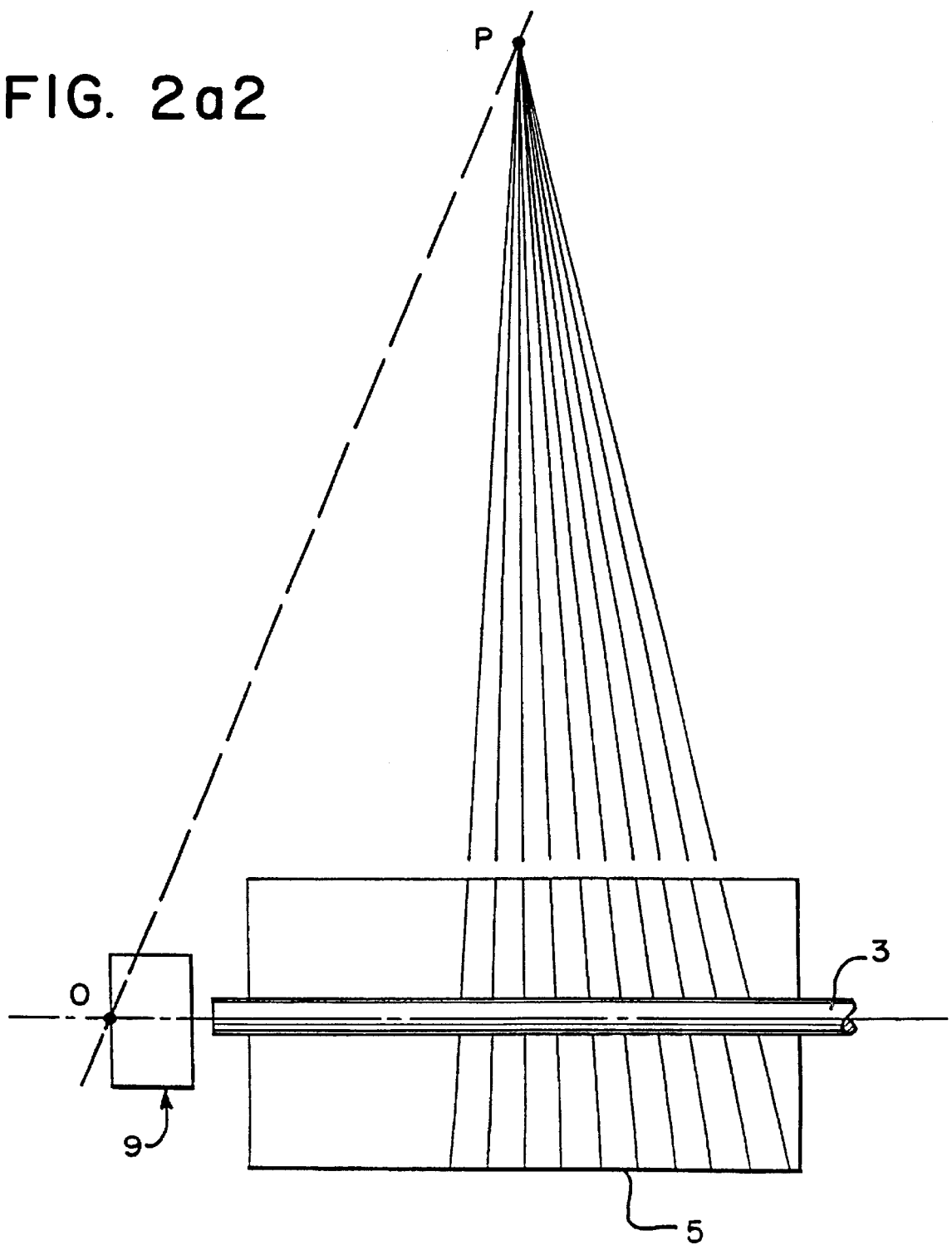
FIG. 2a2

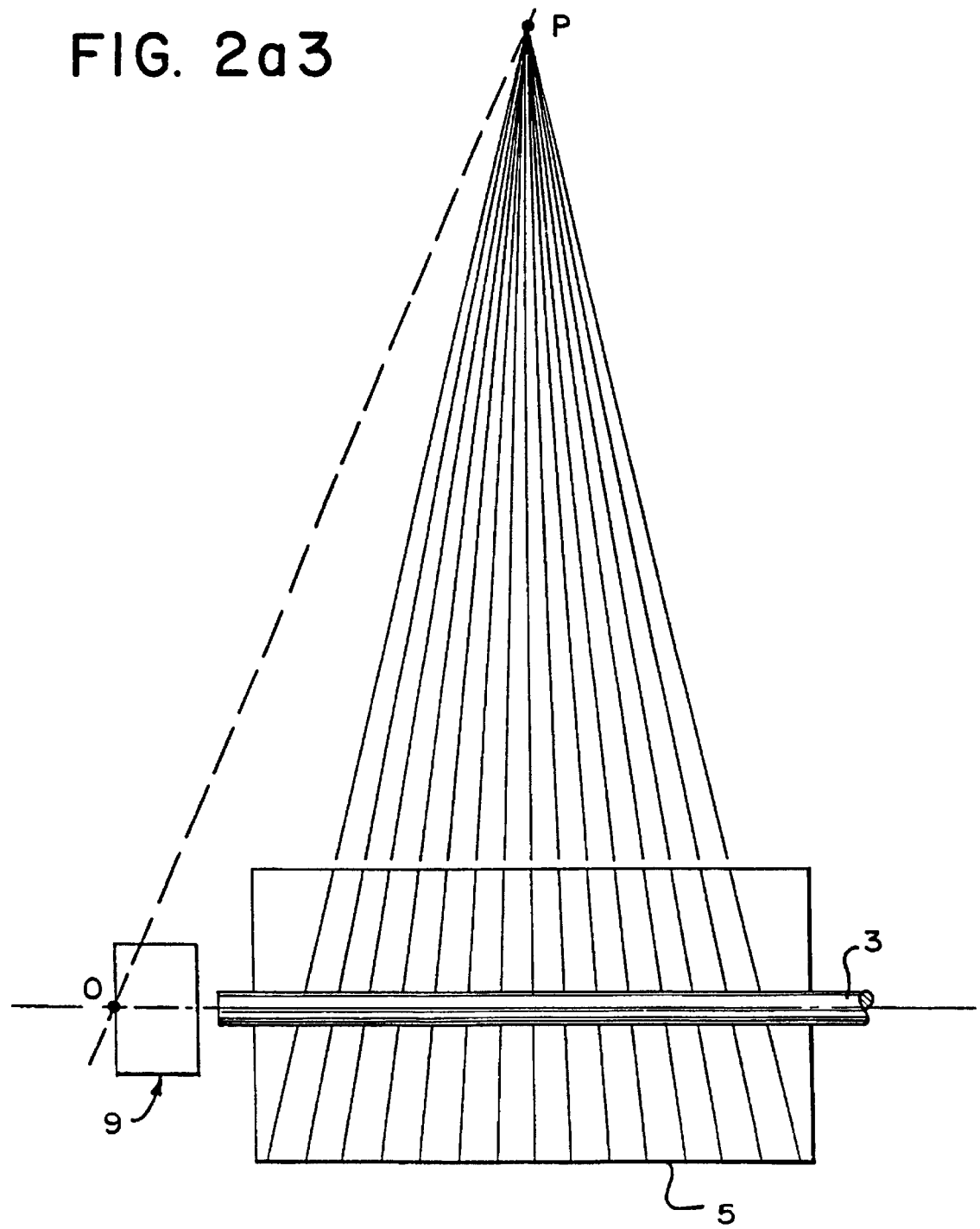
FIG. 2a3

FIG. 2b1
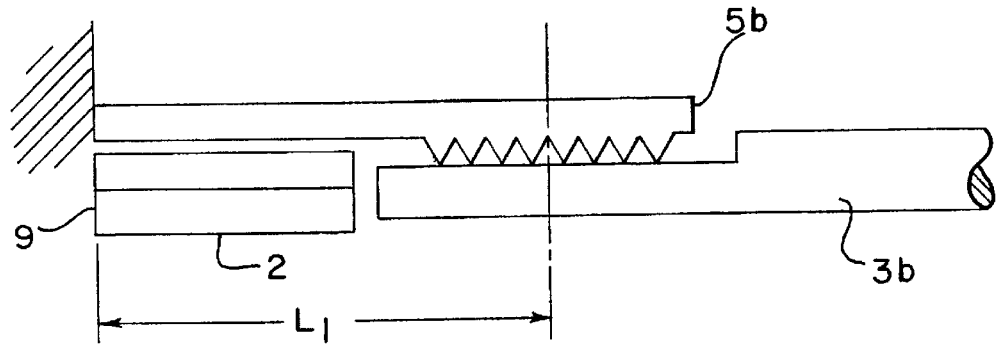
FIG. 2b2
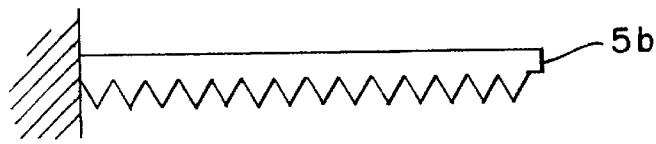
FIG. 2b3
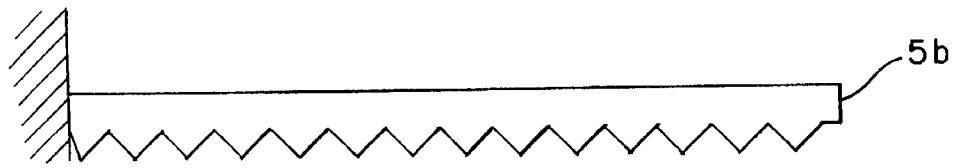
FIG. 2c
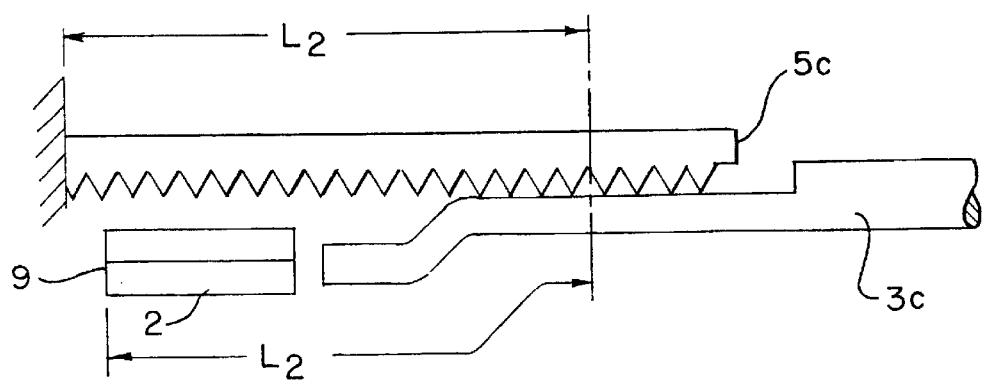

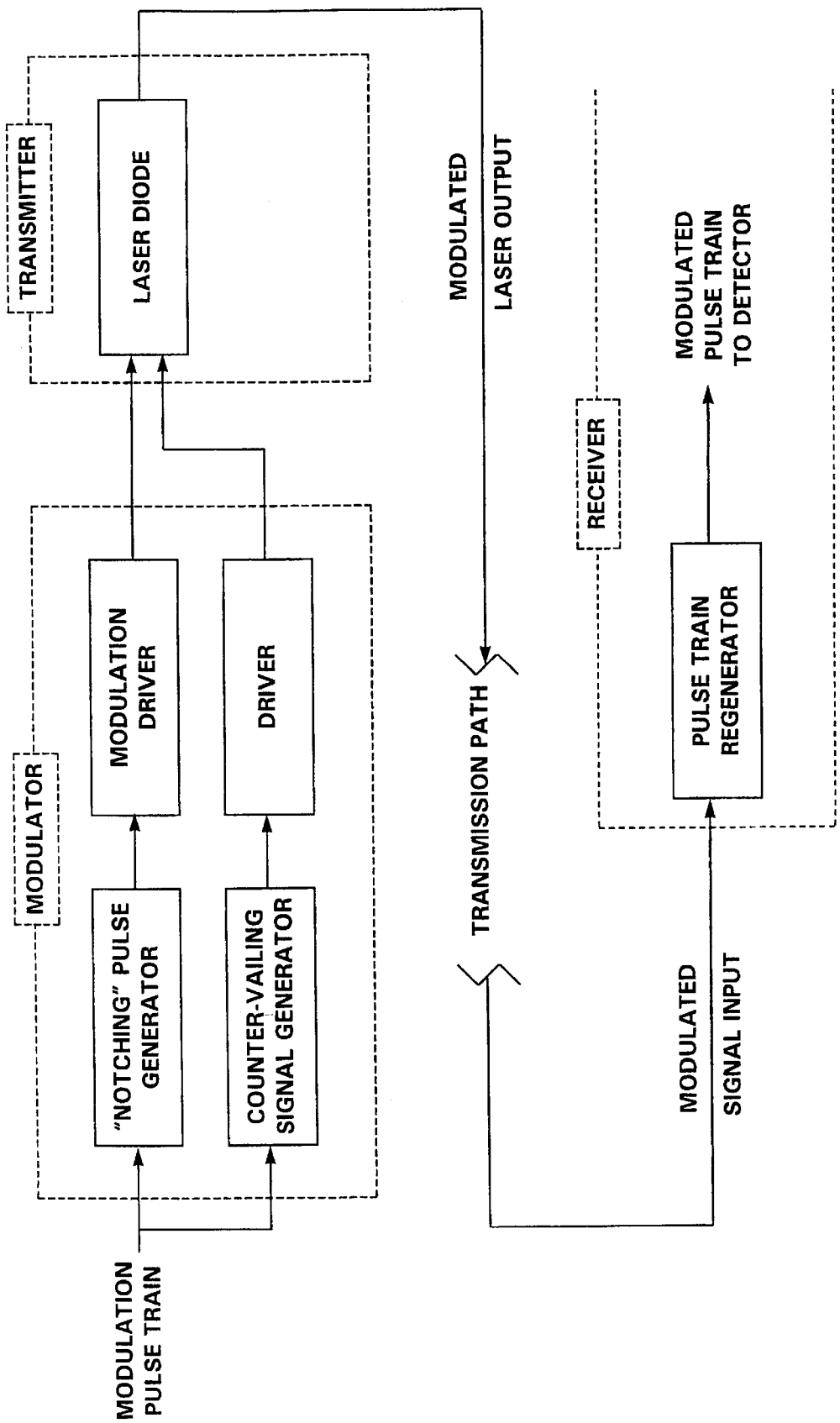

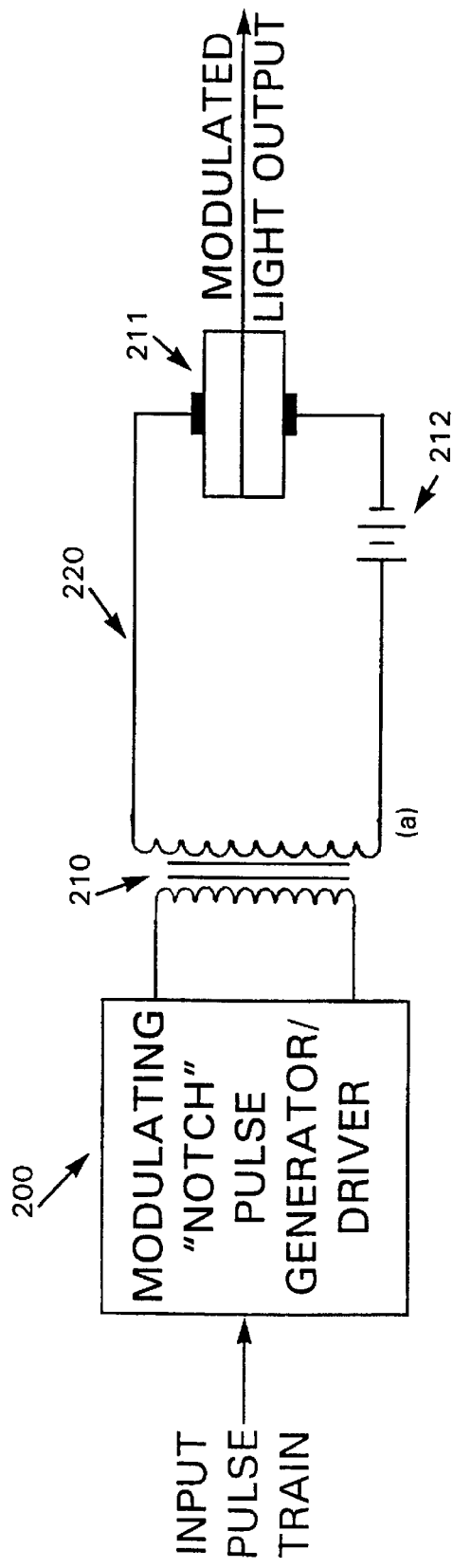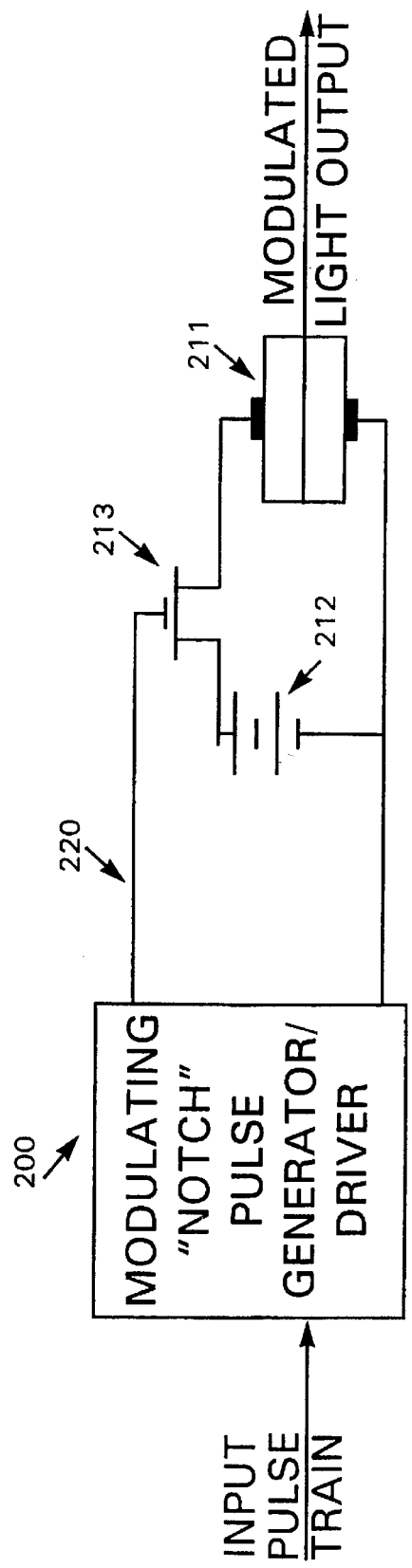

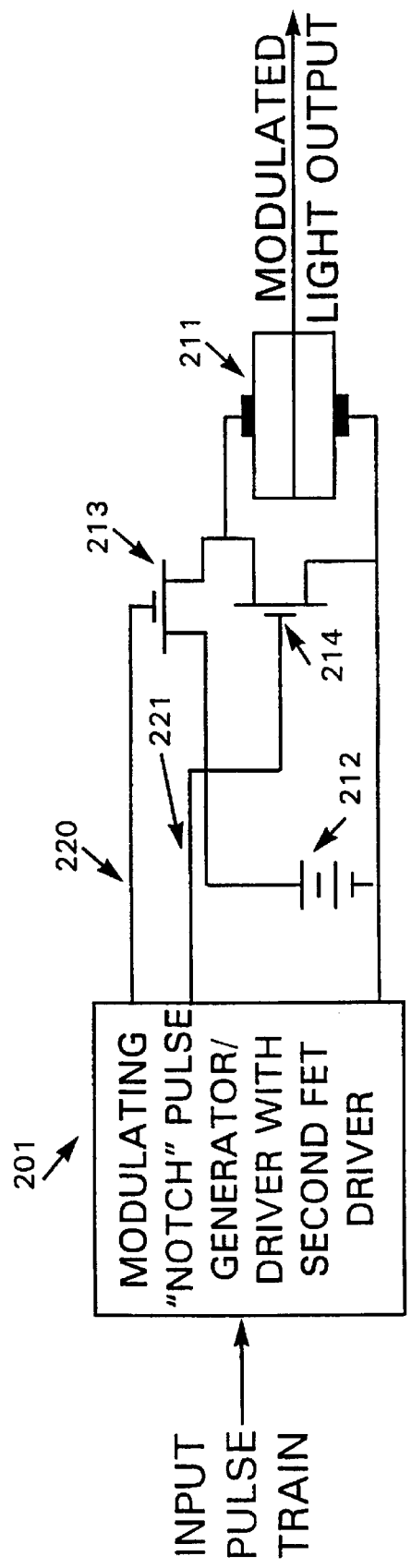
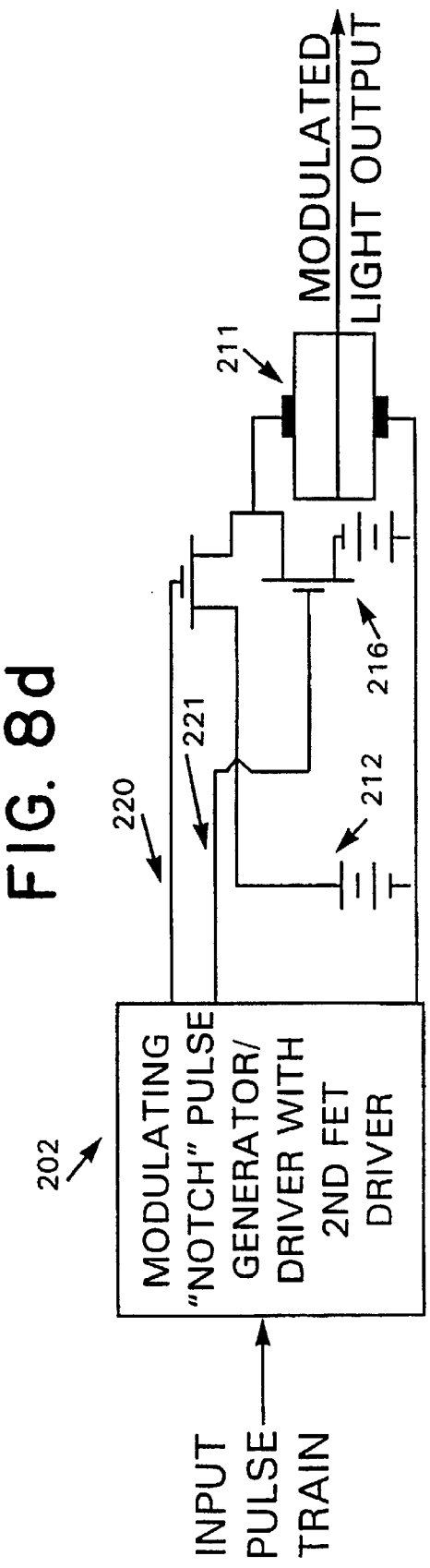

US 6,868,101 B1

LOW COST MEANS OF MODULATING A LASER

RELATED APPLICATIONS

This application claims priority pursuant to 35 U.S.C § 119 from U.S. Provisional application Ser. No. 60/026,255 filed Sep. 13, 1996 and Provisional application Ser. No. 60/029,733 filed Oct. 23, 1996, the entire disclosures of which are hereby incorporated by reference.

FIELD OF THE INVENTION

This invention relates to wideband modulators appropriate to extended-cavity lasers and to wavelength division multiplex networks using such lasers.

BACKGROUND OF THE INVENTION

Ongoing efforts to effect major economies in hookup to fiber-optic networks have as one of their goals the extension of fiber-optic service, with its inherent broadband capability, to ordinary subscribers. One such effort is disclosed in U.S. patent application Ser. No. 08/234,955, filed. In that application, a multiplicity of low cost lasers are embedded in respective fiber-extended cavities for tunability and are referenced by servo loops to a remote, stable laser source, whose temperature characteristics are thus conferred on each of those low cost lasers. The servos are inexpensive, yet they prevent laser output stability from being compromised by numerous thermal, mechanical and output coupling problems. As a result, major economies are achievable compared to traditional devices and architectures. However, the said application does not also disclose appropriately low cost modulation means; If ordinary modulation means were employed, their relatively high cost, on the order of several times the cost of the tunable lasers disclosed in the application would substantially diminish those economies.

To illustrate, one of the least costly wideband modulating means is an external lithium niobate waveguide modulator. In such a modulator, an input signal is split in two and transmitted along parallel paths in lithium niobate waveguides. By using a modulating signal to differentially bias the two paths, phase shifts are introduced which cause destructive interference when the two paths are later re-merged. Another type of wideband modulator is based on electro-absorption within the laser. If used with ordinary laser sources, these types of modulators may add on the order of one-fifth or less of the cost of the laser to system costs. However, if used with the previously described low cost lasers, the same modulators would add on the order of triple the laser cost to system costs. Clearly, a truly low cost modulator is needed if such low cost lasers are to be utilized advantageously.

To fully understand the special coupling and modulation requirements of such extended-cavity lasers, a brief description of their structure and operation is given.

Application Ser. No. 08/234,955 relates to a class of devices known as fiber-extended-cavity lasers. In that class of lasers, a modified laser diode is typically used as the active element. While an ordinary laser diode has two reflective ends that serve to define the resonant optical cavity that is required for lacing to take place, laser diodes used in fiber-extended cavities have one of those ends anti-reflectively coated so they can no longer lase, and that end is coupled to an optical waveguide, typically a side-polished fiber, that is, a portion of an ordinary optical fiber from one side of which most of the cladding has been removed.

By positioning a feedback grating at the polished portion of the fiber, the grating will be coupled to the evanescent wave that is accessible there. The grating serves as the second reflective end needed to complete a resonant cavity.

In a preferred embodiment of the invention disclosed in U.S. Pat. No. 5,315,436, of which U.S. patent application Ser. No. 08/234,955 is a Continuation In Part, continuous tuning is effected by use of a divergent grating moved along a precise path. Symmetrical or asymmetrical gratings can also be used, and divergence may be from a true vertex or an effective vertex.

U.S. Pat. No. 5,315,436 also discloses two other methods of continuously tuning a semiconductor laser that use gratings with parallel lines. In all three methods, the feedback grating is loosely, grazingly coupled to the evanescent wave. Such grazing coupling ensures that the grating lines along the entire grating participate substantially equally in the feedback process, as is required for optimum sidemode suppression. In accordance with the well known and easily proved fact that such sidemode suppression requires that the grating length be at least as long as the cavity length, the gratings used in each of these three tuning methods are relatively long.

The referenced patent and patent application make use of these tunable lasers as a component of what is called an Offset Wavelength Tracker (OWT).

An OWT is a tracking spectrometer that incorporates a tunable laser, such as those just described, and that automatically tunes that laser to output a wavelength that lies at a desired offset from a reference wavelength fed to the OWT. The offset is established by the design of the OWT. The tunable laser it incorporates may be modulated by the modulating means disclosed herein.

Although OWTs serve important functions in fiber-optic network architectures, illustratively the generation of hierarchically ordered downstream and upstream wavelength arrays, they are critical to the stability of the tunable lasers themselves. They resolve a number of stability issues stemming from thermal, mechanical and coupling problems. They confer on the numerous inexpensive laser diodes at varying ambient temperatures in a communications network the temperature stability of a single, high quality, temperature controlled wavelength reference source at a central office. They eliminate the need for an isolator between such laser diodes and the optical lines they drive. They eliminate the need to keep track of downstream and upstream wavelength assignments, a major record-keeping task. They permit all the required wavelengths to be generated with a small number of OWTs of slightly different design, permitting the economies of scale associated with the extensive use of substantially the same few components. They even confer on the network substantial immunity to installer error. In any network where a reference wavelength is available, it is advantageous to embed any of the tunable lasers disclosed in the referenced patent and application in an OWT, if only to ensure their stability. Indeed, except for certain special non-network applications, the OWT is, properly speaking, the tunable source, rather than the stand-alone laser diode with its associated tuning grating.

As earlier noted, a feature present in all three of the tunable laser structures mentioned above is their long cavity length, typically on the order of an inch. Typical laser diodes have an active region that is between 100–500 microns long, so the cavity is between 50 and 250 times longer than the cavity of an ordinary Fabry-Perot laser. This presents an opportunity to directly modulate the laser while reducing the wavelength pulling that occurs with such modulation by approximately two orders of magnitude.

A central design goal for the extended cavities discussed herein is that they be as short as possible. There are two main reasons for this.

First, the feedback grating used for tuning also effects the sidemode suppression that is critical to the prevention of cross-channel interference in dense wavelength division multiplexing. For optimal sidemode suppression, the grating must be at least as long as the cavity. Secondly, as will be shown, the maximum modulation rate of the novel modulation devices and method disclosed herein is inversely proportional to cavity length.

Since the means by which the laser diode is coupled to the fiber of the optical cavity critically impacts both the length of the feedback grating (and thus its cost, since long gratings are costly) and the maximum achievable modulation rate, those coupling means will be dealt with at length.

OBJECTS OF THE INVENTION

It is an object of the present invention to provide inexpensive wideband modulating means for the extended-cavity lasers, thus preserving the latter' cost advantages for inexpensive fiber-optic service.

It is a further object of this invention to provide very short and inexpensive micropositioning means that are suitable for both laser-to-fiber coupling and for the compensation of manufacturing tolerances, and that will permit the fabrication of the cavities that are needed for the achievement of wideband modulation by the methods disclosed herein.

SUMMARY OF THE INVENTION

The present invention discloses a novel means for low cost wideband modulation of an extended-cavity laser. These entail the use of each pulse in an input modulating pulse train as the trigger for the generation of a brief pulse, herein called a "notch" pulse, that is, a pulse that briefly diminishes (or notches) the normal laser drive current. Each "notch" pulse is used to drive the semiconductor laser embedded in an extended cavity with a current that flows opposite to its normal drive current. This serves to diminish the inverted charge-carrier population essential to lacing action, so the laser output falls sharply in a form of amplitude modulation. The "notch" pulse is of brief duration so that upon its termination the laser promptly begins to restore its output power level by amplifying the residual signal level in successive passes through the optical cavity. At a receiver location the leading edge of that laser output signal waveform can then be used to trigger a pulse generator to replicate the input modulating pulse train. The fact that the laser is a very short portion of the long, largely passive total cavity length, sharply reduces the wavelength pulling ordinarily associated with direct laser modulation. A means for suppressing even that small residual wavelength pulling is also disclosed, and applied to both extended-cavity lasers and ordinary lasers.

In accordance with the requirement that the-extended cavity be as short as possible, the invention further discloses a simple, miniaturized means of micropositioning, based on the differential rotation of nested conical plugs, that can serve to couple the semiconductor laser to the cavity and that is inexpensive so that it can remain as a permanent part of the structure.

BRIEF DESCRIPTION OF THE DRAWING

Other objects and advantages of this invention will become apparent upon reference to the appended figures and explanatory text.

FIG. 2 shows a guide block containing a side-polished fiber, and a moveable carrier with a grating that is controllably coupled to the side-polished fiber.

FIG. 6 shows a functional block diagram of the modulation method.

FIGS. 8a, 8b, 8c and 8d are diagrams of various circuits by which to modulate by laser.

DETAILED DESCRIPTION OF THE INVENTION

Figure 1A:
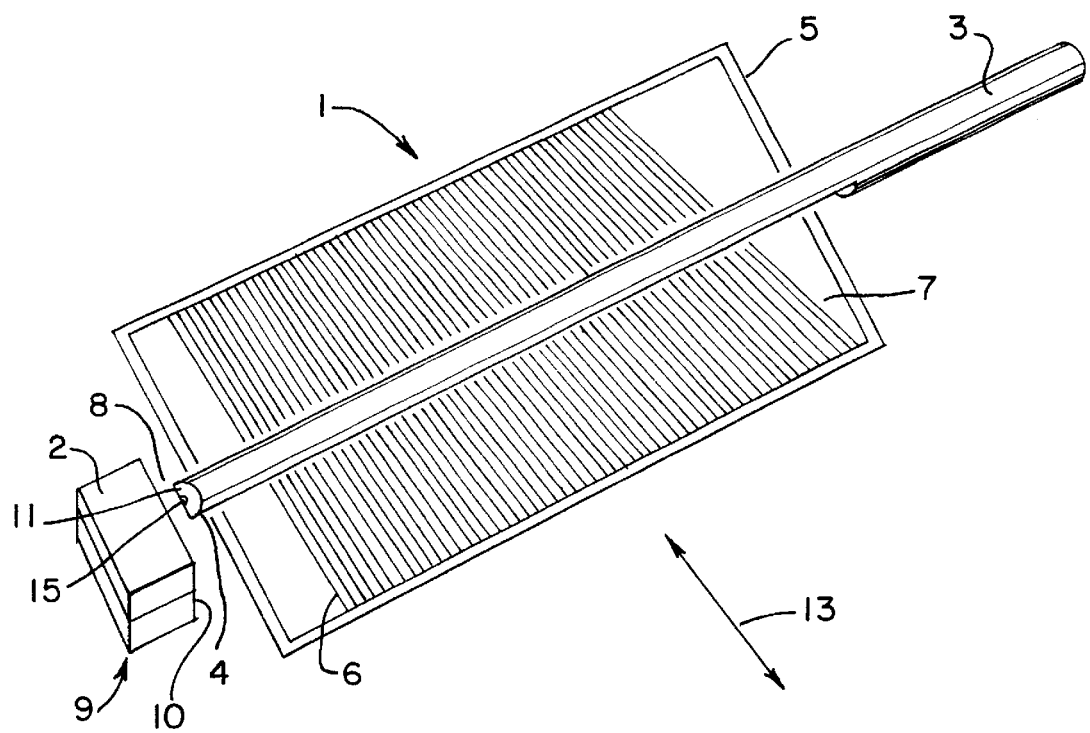
FIG. 1a shows a laser diode coupled to a side-polished fiber, which is itself coupled to an asymmetrically divergent grating.
Figure 1B:
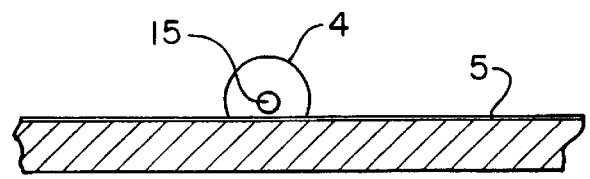
FIG. 1b shows in cross-sectional view the position of the side-polished fiber in relation to the grating carrier.

FIG. 1a illustrates an extended-cavity laser with which the present invention is applicable. Cavity length is illustratively considered to be approximately the distance from the rear, or left-hand, end of diode laser 9 to the center of grating 5. This is much longer than the length of the active region, the latter being substantially the length of diode laser 9. The dimensions of diode laser 9 relative to the grating 5 are greatly exaggerated in these figures, so that, in reality, the cavity's active region is only a quite small fraction of cavity length.

FIG. 2 shows a guide block 16 in which the side-polished optic cable is embedded. The block is to be moved relative to the grating 5 in a grazing manner to achieve continuous tuning of the laser, as described in the aforementioned patent.

Figure 3:
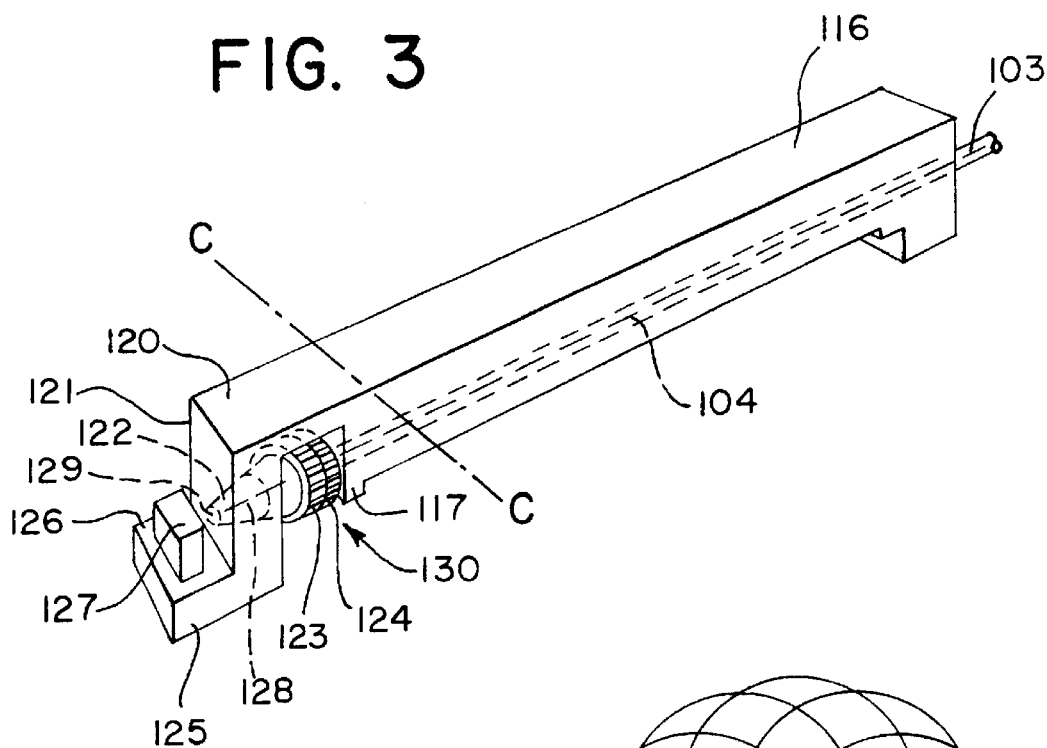
FIG. 3 shows a portion of the guide block of FIG. 2, to which laser mounting and coupling elements have been added.

FIG. 3 shows a portion of a guide block 116 and laser diode mount, corresponding to the narrow, central portion of guide block 16 of FIG. 2, with added elements for mounting a laser and coupling to it. This portion, the part bounded by section lines A and B, is shown as 116 of FIG. 3. This partial view shows details of the micro-positioning coupling method that otherwise would be concealed.

Comparison of FIG. 3 with FIG. 2 shows that forward of line C—C. there have been added:

A horizontal extension section 120, extending only from the upper surface of 116 so as to leave a gap 130 below. A vertical extension section 121 dependent from 120, comprising a conical seat 122 adapted to receive a pair of nested cones 123 and 124 through which may be threaded center fiber 128 of side-polished fiber 104. Nested cones 123 and 124 have integral spur gears, accessible from the side or the bottom, by means of which they may be independently rotated.

A horizontal section 125, extending from 121 and comprising a shelf 126 on which a laser chip 127 may be mounted.

In operation, the proximate face 131 of laser 127, typically a cleaved face, serves as one reflective end of a fiber-extended laser cavity. The laser's distal face, antireflectively coated, is coupled to the end 129 of center fiber 128 of optical fiber 104. End 129 of optical fiber 104 is preferably formed into a microlens that is anti-reflectively coated to enhance coupling to the laser chip's emitting spot. It will also be closer to the chip than diagrammatically shown in this view, which exaggerates the spacing in order to show the tip of the conical micro-positioner. Optical fiber 104 has had most of the cladding removed (ground away) from one side to form along its length a side-polished region where coupling may be effected between a grating and the evanescent wave. As in FIG. 2 a divergent grating, so disposed as to effect coupling to the evanescent wave, can be moved to tune the extended-cavity laser.

It will be appreciated that guide block 16 of FIG. 2 can be made to contain a plurality of side-polished fibers 4, illustratively parallel to and uniformly spaced from one another. In such a configuration, a single feedback grating serves to tune a plurality of laser diodes, each of which would be coupled to a respective side-polished fiber, and each of which would be separately modulated. The effect of tuning such an array of equidistantly spaced, parallel cavities would be to shift their wavelengths, as a group, up or down in the laser' operating band.

Figure 4A:
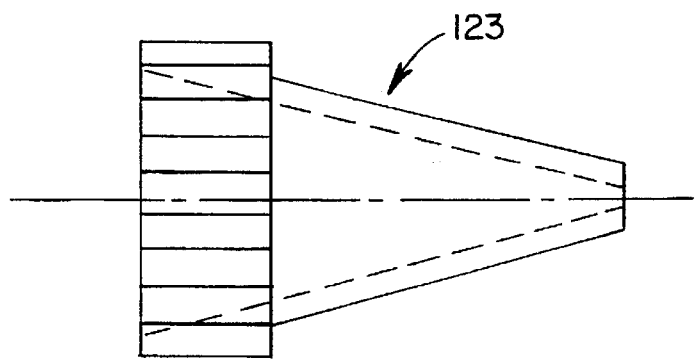
FIGS. 4a and 4b show respectively the outer and inner nestable conical plugs of a micro-positioner for an optical fiber.
Figure 4B:
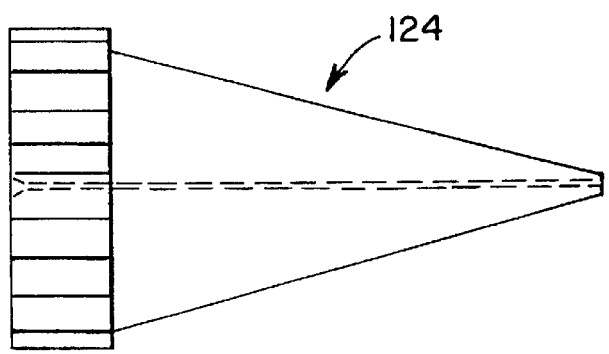
Figure 4C:
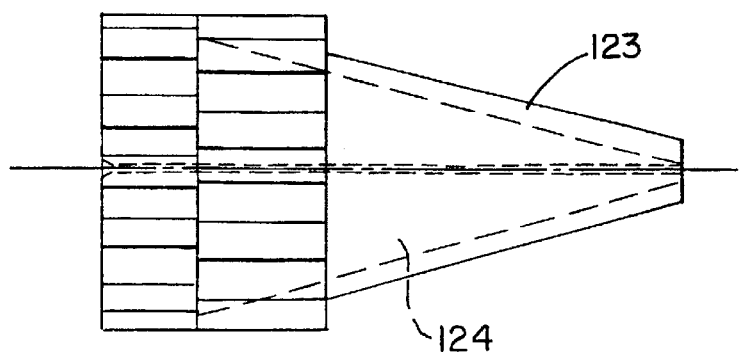
FIG. 4c shows the conical plugs of FIGS. 4a and 4b nested.

FIG. 4 shows details of micro-positioning plugs 123 and 124, including typical values of the offset inner wall dimensions of hollow plug 123 and of the offset center bore of solid plug 124 that 123 is designed to accept. Note the integrally molded spur gear on each plug. When each is driven by the mating gear of a tuning drive (not shown), the relative speeds of the two drives will determine the pattern in which the optical fiber tip 129 is scanned. Referring back to FIG. 3, note that the spur gears are accessible from the side or the bottom. In the preferred embodiment of FIG. 5 there is no access from the end. A laser chip is used, rather than the typical laser diode in a can with an output window. Commercially available couplers are typically designed to couple to the latter.

Coupling to an unhoused laser diode chip is advantageous since it permits access to both ends, whereas access is restricted to only the emitting face when the chip is viewed through the window of a can-mount. The reflectivity of each of the cleaved ends of a typical laser diode is on the order of 30 percent, so either end can be used for output signal. In the design of the OWT disclosed in U.S. Pat. No. 5,315,436, the laser must be coupled to its tuning structure, and must also provide an output both to the network and as reference wavelength to the next-in-line OWTs. Use of both ends of the laser chip can effect both functions without the relatively high cost of a separate coupler. In addition, use of the laser's back wall as an output signal port permits the insertion there, external to the resonant cavity, of the shutter that is required to prevent cross-channel interference while the OWT is tuning itself to its hierarchically required wavelength.

Note that gap 130 is preferably made only long enough to admit nested conical plugs 123 and 124 into conical seat 122. Gap 129 must be kept as short as possible in order to minimize that part of cavity length that is not coupled to the grating, thus keep cavity length as short as possible.

Consider, for example, that the cavity length from the laser's rear reflective wall to just past the front spacer leg 117, the first point at which the feedback grating can couple to the evanescent wave, is held to no more than 0.5 inches. Then, if the grating length is 1.0 inch and the grating is so coupled that it feeds back essentially uniform energy along its entire length, the grating's effective center of reflection will be at its mid-point, i.e. at 0.5 inch. Those two components of the cavity length sum to 1.0 inch, so the grating will satisfy the requirement that it be at least as long as the cavity length.

It is important to minimize cavity length, in order to minimize the interpulse delay inherent in the multiple cavity traversals needed to restore output signal level after each modulating "notch" pulse. However, the fact that the cavity, however short it may be made, is nevertheless much longer than the laser diode's active region forms an important factor for the modulation method of the present invention. This can be understood by considering what happens when the charge carrier density in an optically active medium is altered, illustratively by a modulating pulse. When this occurs, its index of refraction is changed. If a laser diode's index of refraction is changed, a proportionally greater or lesser number of wavelengths will fill its fixed cavity length. Out of the broad noise spectrum of the laser diode, a wavelength satisfying the new condition for resonance will be pumped up by successive passes through the gain medium and will emerge as the new output wavelength. This is the well-known phenomenon of "wavelength pulling" associated with changes in drive current, which would ordinarily cause cross-channel interference in a Wavelength Division Multiplex (WDM) communications network.

The modulation method disclosed herein involves such alteration of laser drive current, yet does not result in significant wavelength pulling because the laser's active region is so small a part of cavity length. This fact can be appreciated by comparing the length of the active region, typically from 100 microns to 500 microns long, with the length of the rest of the cavity, typically on the order of an inch. In the fiber-extended cavities disclosed in U.S. Pat. No. 5,315,436, any modulation-induced change in effective cavity length only takes place within the active element, since the remainder of the cavity, being passive, remains unchanged. The effect is to diminish the wavelength shift by substantially the ratio of the length of the laser diode's cavity to the length of the entire fiber-extended cavity, i.e., in the exemplary cavities under consideration, by approximately 100:1. A shift of one nanometer is thus reduced to 0.01 nanometer, a negligible change in even a dense Wavelength Division Multiplex network, where adjacent channels may be only one nanometer apart. The modulation method disclosed herein takes advantage of this fact.

In certain applications, even this small wavelength shift may be objectionable. It is possible to reduce even that small shift essentially to zero, by building into the cavity a segment of an optically active material and driving that segment with a countervailing signal, that changes the index of refraction of that segment in a direction opposite to and by an amount proportional to the change in the index of refraction of the laser diode being modulated, thus keeping the effective cavity length constant despite the refractive index changes. That segment may be one section of a two-section semiconductor laser, whose other section comprises the gain medium.

In the modulation method disclosed herein, high laser gain is desirable, in order to speed post-modulation laser output power level restoration and thus maximum modulation rate. Typical active channel lengths vary between 100 and 500 microns, and for a given type of laser, gain is proportional to channel length. The need for relatively high gain, as expressed in a design choice in which a long active channel is chosen rather than a short active channel, will however have minor effects on wavelength pulling because, practically speaking, the ratio of cavity length to active channel length remains high whatever the channel length.

A common problem in fabricating assemblies containing lasers is how to couple an optical fiber to that point on the laser where emission takes place. In a diode laser, for example, the emitting spot is typically only 3 or 4 microns wide, while the center fiber of a typical optical fiber line is 9 microns in diameter. Aligning the two so they are efficiently coupled requires precision coupling means. The shortest such means is a tubular coupler containing a positionable focussing lens and a three-axis alignment mechanism controlled by three respective, fine-pitch set screws. However, if a tubular coupler were used in a fiber-extended-cavity laser, it would extend the cavity by its own length plus the length of its output pigtail. These total at least two inches, essentially tripling the round-trip cavity length compared to a bare, butt coupled fiber, and thus reducing by two-thirds the maximum modulation rate. A further problem is the coupling efficiency of these devices; On the order of a one-way coupling efficiency of 0.55 is achievable, so with the two passes of a round trip traversal of the laser cavity, the coupler imposes a 70 percent loss. This results in a further diminution of the maximum modulation rate, since, in the modulation method disclosed herein, such losses reduce the cavity gain on which the rapid restoration of laser output level after each modulating pulse depends.

Figure 10A:
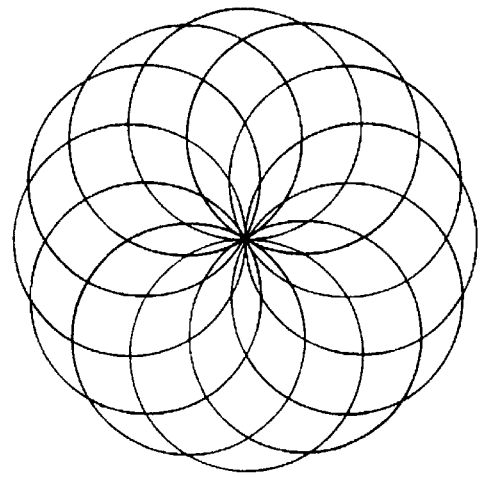
FIGS. 10a and 10b illustrate two of the scanning patterns produced by the micro-positioners described herein.
Figure 10B:
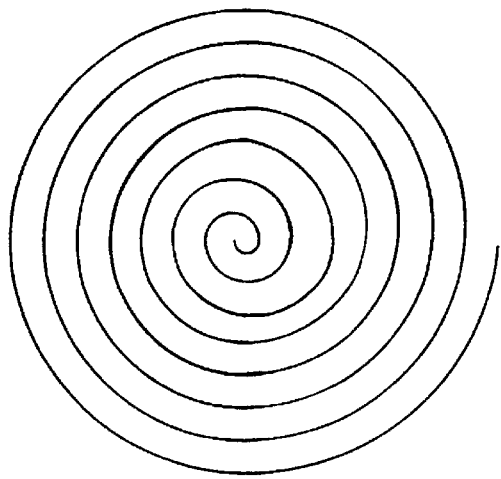

Miniaturized micro-positioning devices are provided in accordance with the invention for easily and inexpensively coupling to such small emitting spots. These devices can also serve as micro-positioning means for the correction of manufacturing tolerances, illustratively in the detector head of an Offset Wavelength Tracker, such as shown in FIG. 10b of U.S. Pat. No. 5,315,436, reproduced here in FIG. 11. In such a detector head, manufacuring tolerances in the spacing Y between the centers of the two pairs of photodetector elements and the spacing between the two signal input ports can be compensated by adjusting the spacing X between the two center fibers at those input ports. While other means of accomplishing these two functions are possible, the simplicity and low cost of the preferred embodiment recommends its use.

The principle involved can be seen in FIG. 8a, which shows in cross-section an optical fiber that contains a concentric center fiber, and, in FIG. 8b an optical fiber that contains an eccentric center fiber.

If the eccentric placed fiber is rotated, its "center" fiber will move in a circle. Reference to FIG. 10f of U.S. Pat. No. 5,315,436 reproduced here in FIG. 11, and the corresponding text shows that such a fiber is suggested as one means of compensating manufacturing tolerances, by rotating it to alter the vertical separation between the center fibers of the clad fibers fed into ports 38 and 39.

This principle of rotating an eccentrically placed fiber (center) can be modified to scan an area, as follows. Let the eccentric fiber be inserted into an eccentric plug (see FIG. 4), which can also be rotated. If the plug and the fiber are then rotated at rates that differ substantially, the fiber tip will be scanned in a pattern resembling a connected series of partially overlapping circles. If the two rotation rates are closely similar, the fiber's tip will be scanned in a spiral pattern.

By properly choosing the eccentricity (or offset from concentricity) of both the fiber and the plug, an area centered at the true center of the eccentric plug can be scanned. If that true center is positioned in the vicinity of the emitting spot of a laser, and that area is scanned by rotating the fiber and the plug, then the center fiber will eventually be positioned over the emitting spot, and thus coupled to the laser. By appropriately fashioning the end of the fiber, for example by forming the end of the fiber into a microlens and anti-reflectively coating it, the coupling efficiency can be maximized. Once coupling has been effected, as evidenced by maximum light output in the fiber, a drop of quick-setting or UV-activated adhesive can be applied to fix everything in place.

Consider now, that even the small segment of eccentric fiber that is needed is costly or unavailable. In that case, ordinary concentric fiber could be used, but inserted into an eccentric plug that was in turn inserted into a second, larger eccentric plug. Rotation of both p lugs will now effect the desired result of scanning an area until the emitting spot is encountered.

Figure 9A:
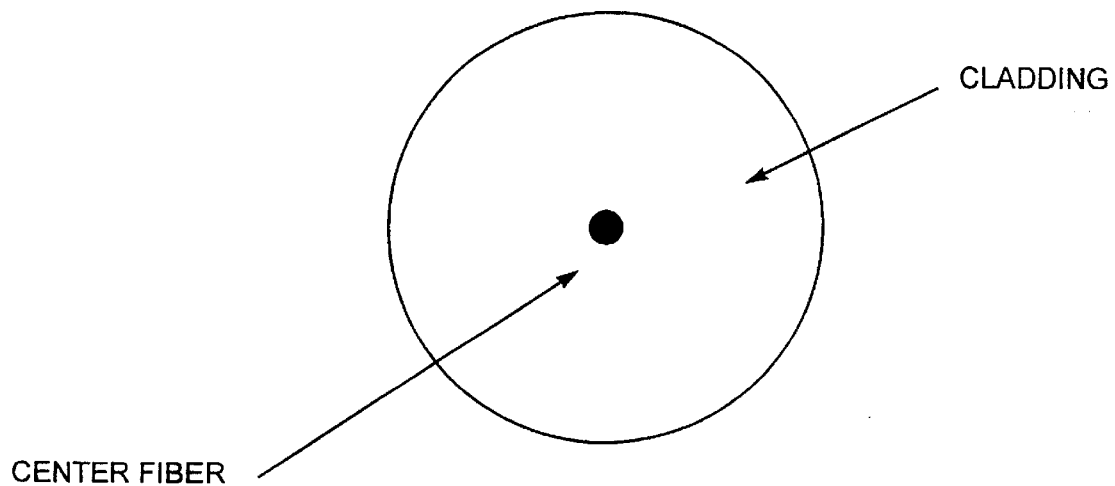
FIG. 9a is a cross-sectional view of an optical fiber whose center fiber is concentric with its surrounding cladding.
Figure 9B:
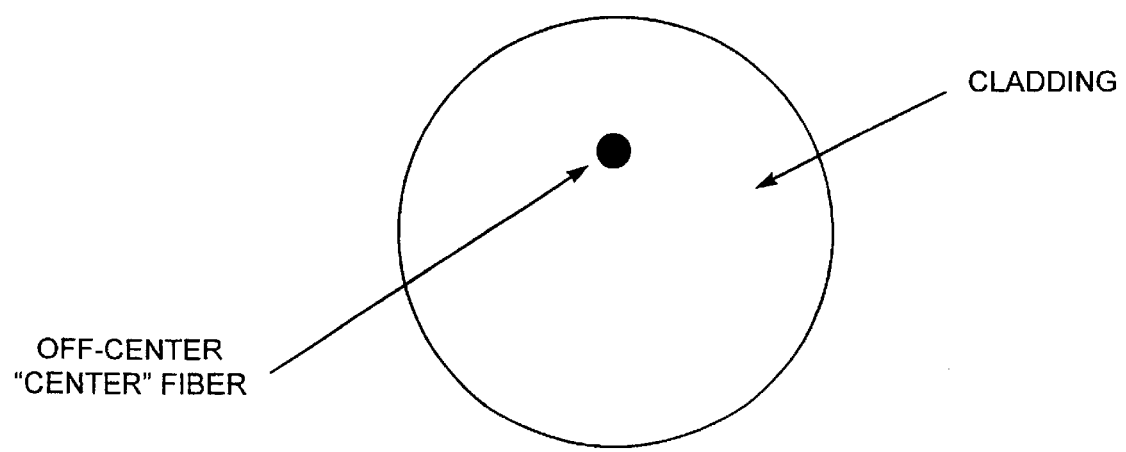
FIG. 9b is a cross-sectional view of an optical fiber whose "center" fiber is eccentric with respect to its surrounding cladding.
Figure 11A:
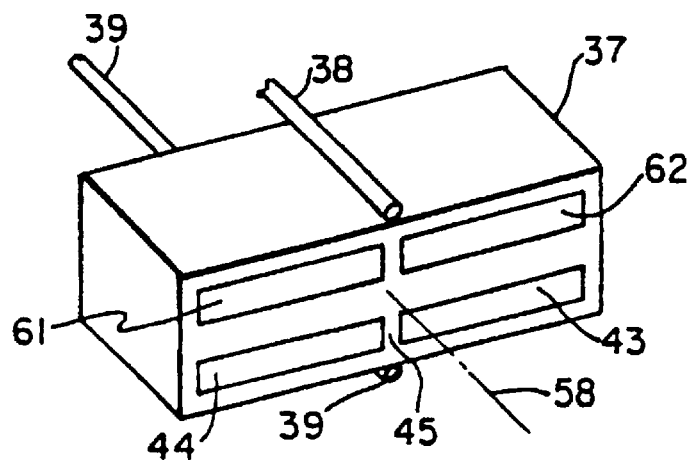
FIG. 11 is FIG. 10 of U.S. Pat. No. 5,315,436, which shows the use of eccentric optical fiber for compensation of manufacturing tolerances.
Figure 11B:
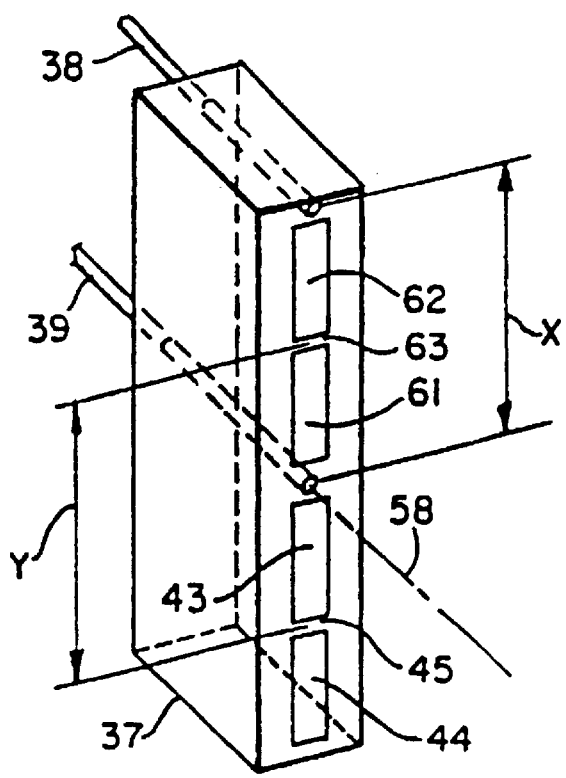
Figure 11C:
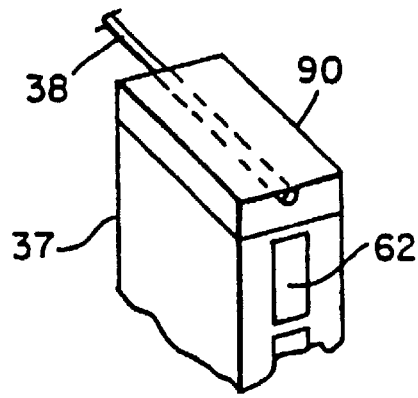
Figure 11D:
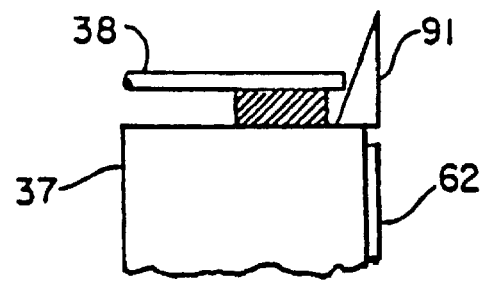
Figure 11E:
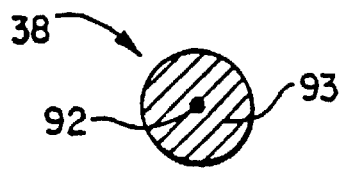
Figure 11F:
Figure 11G:
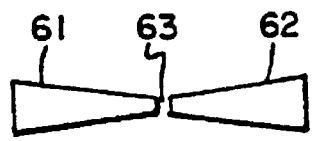

FIG. 4 shows a typical design for such plugs. Note that if the inner wall of the hollow plug 124 of FIG. 4a is offset from the center line of its plug by one-thousandth of an inch, and if the center bore of the solid plug 123 of FIG. 4b is offset from the center line of its plug by one-thousandth of an inch, then a circular area with a diameter of four-thousandths of an inch can be scanned. Offsets can be chosen that are appropriate to effect any desired scan. Note, too, the integrally molded spur gear on each of the plugs 123, 124, that adapts them for automated scanning by a drive mechanism. Marks, not shown, at the gear end of each plug, indicate the position of maximum offset and the point opposite it on the circumference, to aid in initial setup. If both plugs were rotated at the same rate, the tip of an optical fiber inserted into the plug shown in FIG. 4b would be scanned in a stationary circle. If the plugs are rotated at rates that differ substantially the tip of that fiber will be scanned in a pattern resembling a connected series of partially overlapping circles that overlap and surround the center point of the scanned area, as illustrated in FIG. 9a. Finally, if the plugs are rotated at rates that are slightly different, the tip of that fiber will be scanned in a spiral pattern as illustrated in FIG. 9b. For clarity, both of these figures exaggerate the spacing between scan lines; in practice they will be much closer together than shown. Even shorter coupling means can be positioning probes extending from a micro-positioner external to the cavity region that protrude into that region to serve as a jig to scan the optical fiber tip until the desired coupling is effected. The probes could then hold the tip in place while it is attached by an adhesive to a supporting element within that region. Withdrawal of the probes then leaves the structure free for final assembly. Having thus considered the coupling problem, the problem of modulation will now be addressed. A major impediment to the widespread use of bidirectional fiber-optic telecommunications service is the high cost of the laser modulators. Low cost lasers in the upstream and downstream bands are disclosed in U.S. Pat. No. 5,315,436 and in the referenced patent application. The modulators disclosed herein also can be implemented at relatively low cost.

In these modulators, very short pulses of current modulation are applied directly to the laser diode in a fiberextended-cavity laser, in order to diminish the population inversion in its active region, so that its output power will briefly drop. In effect, this is a form of amplitude modulation.

Typically, the leading edge of each pulse in an incoming pulse train will be used to generate a modulating "notch" pulse shorter than the incoming pulse. This "notch" pulse is used to directly modulate the laser diode, by applying to the laser diode a brief countercurrent to its normal drive current. This causes a sharp drop in laser output power. Subsequent recovery of the laser output to its initial power level takes place between modulating pulses, as successive round-trip traversals of the laser cavity by the light emitted by what remains of the emitting population builds laser output back to full power level. After transmission, the received pulse train can serve as triggers for a pulse generator that can regenerate the original input pulse train.

Such a modulation method would be impractical with an ordinary Fabry-Perot diode laser, because as noted earlier, the change in charge-carrier density in the active region changes the material's index of refraction and, therefore, the effective cavity length, resulting in wavelength pulling. However, in fiber-extended-cavity lasers, illustratively those described in the referenced U.S. patent and allowed application, the laser diode is a quite short active element in a much longer passive cavity. As noted earlier, this will reduce the wavelength-pulling effect by approximately 100:1. At the same time, the feedback grating suppresses the buildup of any wavelength that does not correspond to its own half-wavelength interline spacing. The result is effective suppression of the pronounced wavelength pulling that would attend such an amplitude modulation method if it were attempted on an ordinary Fabry-Perot laser diode.

For applications where substantially complete suppression is required, for example in ultra-dense WDM networks with very closely spaced channel wavelengths, that can be achieved by directly compensating for the change in effective cavity length. Illustratively, a segment of optically active material, transmissive of the propagating wavelength and inserted in the optical cavity, could be driven by a countervailing waveform synchronized with the modulating waveform to alter that segment's index of refraction, and therefore its effective optical length in the opposite direction, to maintain substantially constant effective cavity length despite the modulation's effect on the laser diode's index of refraction.

The optical transmissivity of that material must be such that its insertion loss is less that the one-way cavity gain, and, indeed, as low as possible to minimize the number of passes required for substantially complete restoration of laser power output level.

FIG. 7 illustrates the relative timing of the pulse trains. The input pulse train of the desired modulation to the laser diode is shown in 71. Upon sensing the leading edge of each pulse in that train, a pulse generator generates a corresponding, brief pulse illustratively pulses like those of 7b or 7c, that are used to briefly diminish or "notch" the laser diode drive current to diminish the charge carrier population inversion in the active region. The resultant falloff and subsequent recovery in laser output power level is illustrated in 7d. The depth of modulation is controlled to provide adequate margin against amplification to saturation by the subsequent system amplifiers, while permitting recovery to substantially full power level with a small number of traversals of the optical cavity. At a receiver, a pulse generator that can be triggered by either the leading edge of the fall in received laser power or by the leading edge of the subsequent rise in received laser power can be used to replicate the original input modulation pulse train, which is then available for ordinary processing. The net effect is an increment to the time delay in the receipt of the input pulse train, as would occur if the transmission path were lengthened.

Note that to illustrate their timing inter-relationships, all of the waveforms shown here, except for the laser's output power restoration waveform as it rises from full modulation to restored power level, are shown as being of substantially rectangular form. However, it may be desirable for the modulating "notch" pulse to be of non-rectangular form or even of composite form, illustratively a short pulse atop a wider pulse, to better control the carrier depletion process. Obviously, "notch" pulses of different form than those shown in FIGS. 7b and 7c may be used.

FIG. 8 illustrates five different circuits for modulating a laser diode by this means.

In the circuit shown in FIG. 8a, the "notch" pulses generated by generator/driver 200 are coupled to driver signal lines 220 and 221 through radio-frequency transformer 210. 212 represents a D.C. bias line. There are two bonding pads, at the top and bottom of laser diode 211. This method can be used to briefly push the laser drive current toward zero with a countercurrent pulse or, with a large enough signal, even beyond zero. The latter might be used to invert the sense of the drive current, to speed the fall in laser output level by sweeping some of the excited-state charge carriers out of the active region, yet without entirely quenching laser output by excessive depletion of the population inversion.

In the circuit shown in FIG. 8b, the modulating "notch" pulses drive field-effect transistor (FET) 213. This method has the advantage of very low inductance, but cannot push the net drive current beyond zero to invert its sense, should that be desired.

In the circuit shown in FIG. 8c, a second FET 214 is combined with FET 213 in a so-called totem-pole configuration. Generator/driver 201 differs from 200, in that it outputs an additional signal on signal line 222. That signal is typically pulsed on in synchronism with the modulating "notch" pulse, to discharge any stray capacitances.

In the circuit shown in FIG. 8d, FET 214 has been given its own bias line 216. This permits the laser diode to be driven with a reverse-bias signal.

Other configurations might utilize bi-polar transistors rather than or even in combination with FETS, capacity-coupled drivers, and so forth.

In all cases, a sufficient population inversion must remain to permit rapid restoration of laser output power, since the length of that restoration period will determine the minimum interpulse spacing of "notch" pulses and thus the maximum modulation rate.

While the modulated light output of each of FIGS. 8 is, in each case, fed to an extended cavity, the principle of this modulation method is obviously applicable to an ordinary laser diode, i.e., one whose optical cavity is bounded by its cleaved ends. Of course, lacking an extended cavity and a tuning grating, such a laser would not be tunable. It would however be inexpensively modulatable at quite high data rates, because its short cavity length would permit very rapid restoration of output signal level after the fall in that level triggered by a modulating "notch" pulse. Since the active region of such a semiconductor laser extends along substantially the entire cavity length, the use of the previously discussed segment of optically active material would appear to be necessary. Typically, such a laser would be constructed as a Distributed Feedback (DFB) laser, whose wavelength is established by a feedback grating, illustratively a grating extending along the entire active region of the laser, and which grating, thus being as long as the optical cavity, is also effective in sidemode suppression.

Figure 5:
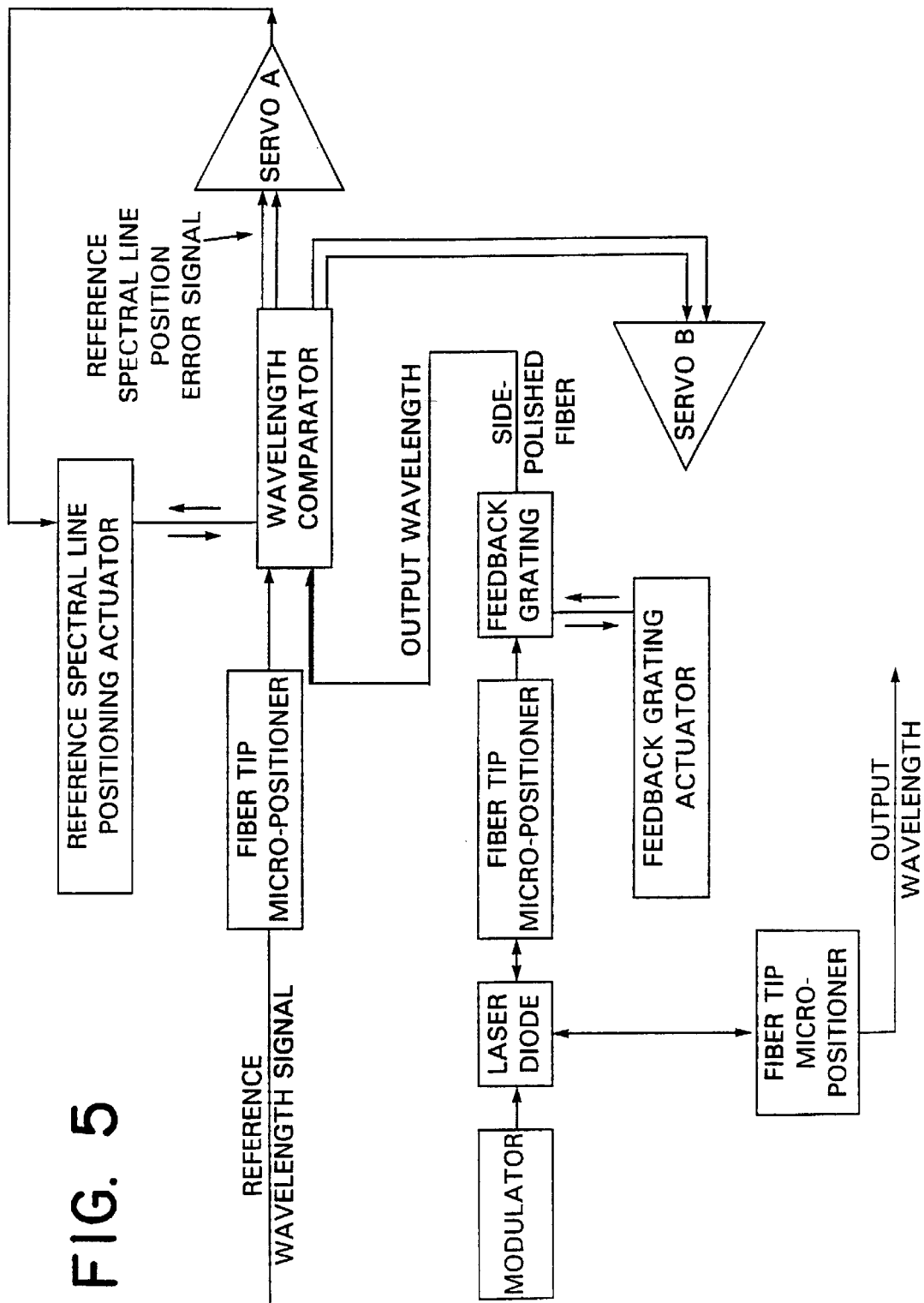
FIG. 5 shows a functional block diagram of an Offset Wavelength Tracker with a modulator for its tunable laser.
Figure 7A:
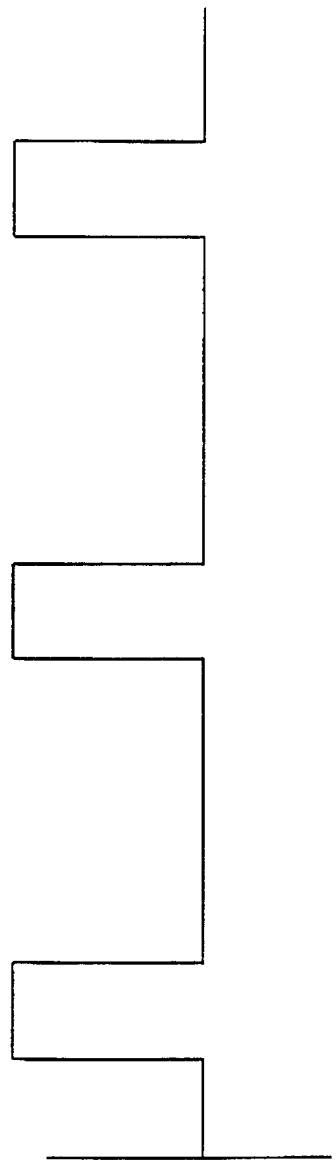
FIGS. 7a, 7b, 7c and 7d illustrate the relative timing of various signals associated with the modulator.
Figure 7B:
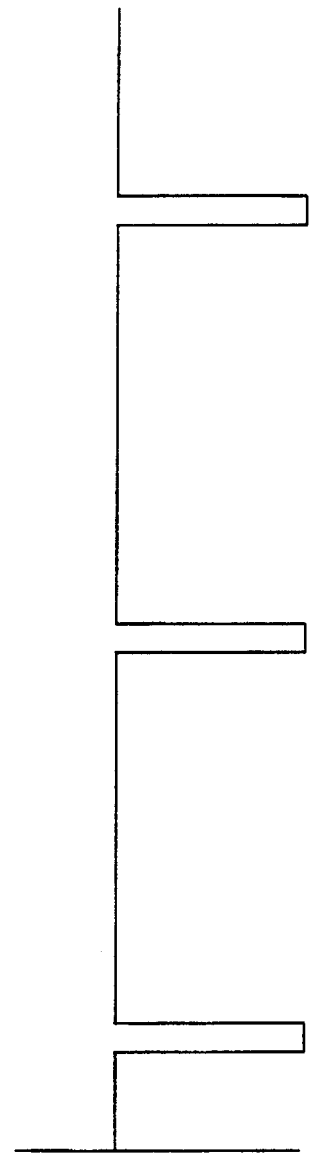
Figure 7C:
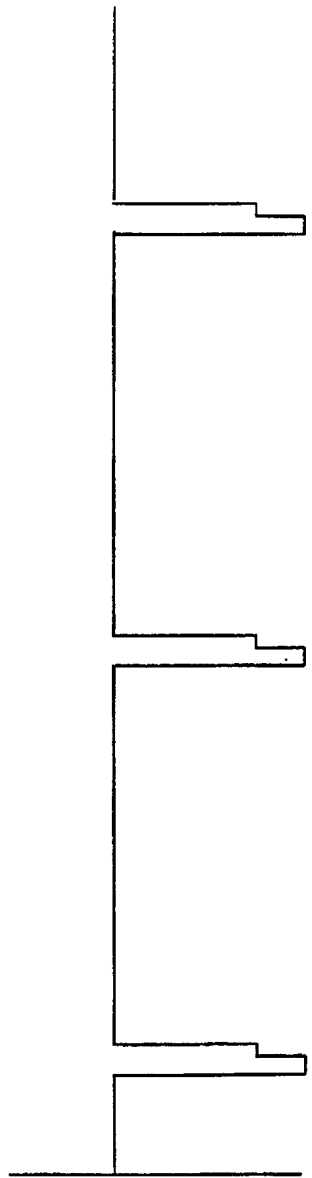
Figure 7D:
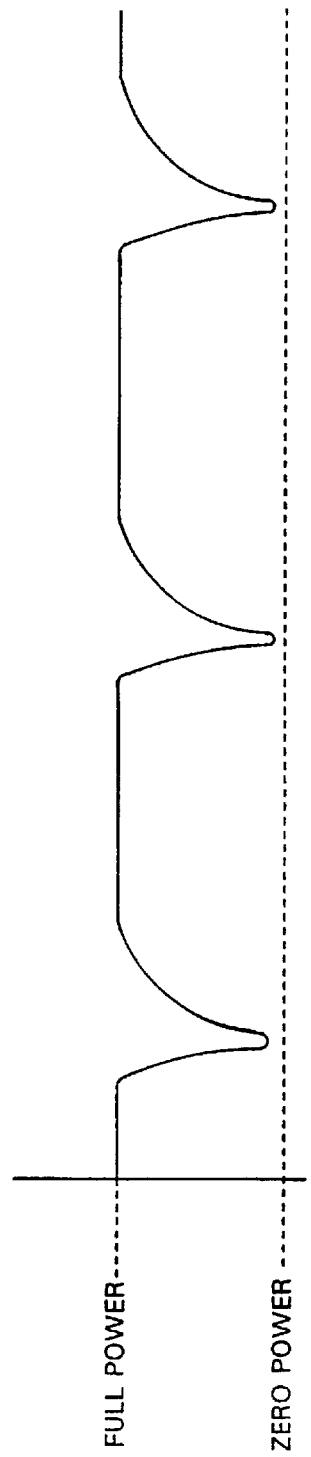

FIG. 5 shows a modulator of a design that accords with the above principles driving the laser diode of an OWT. To the right of the laser diode 310, at its cleaved and antireflectively coated face, the tip of a side-polished fiber positioned by micro-positioner 312, both couples laser diode output to the fiber for interaction with the feedback grating 314 and couples back into the laser diode feedback at the wavelength represented by the grating's interline periodicity where it intersects the side-polished fiber. That bidirectional flow of signal is represented by the double-headed arrow. Note that the side-polished fiber exiting themicro-positioner 312 is loosely coupled to the feedback grating 314, and then fed into the wavelength comparator input port. In the wavelength comparator 340 the wavelength output by the tunable laser is compared to the wavelength of the reference signal 350. Any difference between the two wavelengths that is greater than or less than the designed offset wavelength produces a corrective error signal for servo B 355 that drives the feedback grating actuator 318, which moves the grating, as indicated by the two directional arrows, tuning the output wavelength until zero error results. The loop containing servo A 360 drives its own actuator 362 to keep the reference wavelength centered on a split photodetector, to serve as a fiduciary mark. A separate optical fiber 370, here shown below the laser diode 310, has its tip coupled to the cleaved, uncoated rear wall of the laser diode from which the main output signal is taken. Note that the arrow from the laser to the micro-positioner 372 has only one head, since there is essentially no energy reflected back to the laser. Note the use of a micro-positioner 352 at the reference wavelength input port of the wavelength comparator 340. This serves to move the optical fiber tip to compensate for manufacturing tolerances that would otherwise result in wavelength offset errors.

FIG. 6 shows the modulation method in functional block diagram form. The input modulation pulse train drives both a "notch" pulse generator and, optionally, a countervailing signal generator, each of which feeds a driver. The modulation driver "notches" the laser diode drive current by any desired means, including any one of the circuits shown in FIGS. 8. The optional countervailing signal is here shown driving one section of a two-section laser diode, though it could as readily be used to drive a separate segment of a suitable optically active material. The modulated laser output then traverses a transmission path to a receiver. There, the leading edge of each received pulse can serve as a trigger for a pulse train regenerator, that can replicate the original input modulation pulse train. While not an inherent part of the modulator, this latter function is included here for clarity.

Clearly, the stated objects of the present invention have been realized as set forth in this detailed description. However that description should not be construed as exhaustive of its inventive content, which should be understood to include the numerous variations and alternative embodiments that will be apparent to anyone skilled in the art, without departing from the spirit and scope of this invention.

What is claimed is:

1. An apparatus said semiconductor laser is an active element in a tunable light source having an emission spectrum of substantially single 1 nes, said tunable light source comprising:

at least one active optical element, a respective first reflective end for each said active optical element, a grating with a set of lines that are one of parallel and divergent, said divergent lines diverging frorm at least one of a true vertex and an effective vertex, said grating and said first reflective end of eac h said active optical element cooperating to form a respective laser resonant cavity that cortains each said active optical element, each said active optical element and its resonant cavity cooperating to produce a respective light output having an emission spectrum of substantially a single line, said rieans for effecting a grazing coupling between said grating aid each said laser resonant cavity and for controlling said grazing coupling to maintain substantially uniform reflection from each grating line back to each said active element, each said laser and said resonant cavity being at least one of a resonant cavity without an optical fiber and a resonant cavity having an optical fiber, and means for moving said grating along a path relative to each said laser resonant cavity to simultaneosly and in the same ratio alter both the periodicity of the effective intersections of said grating ines with each said resonant cavity and the effective cavity length of each said resonant cavity to produce a constant longitudinal mode throughout the entire tuning range of said tunable light source.

2. The combination of claim 1, further comprising an Offset Wavelength Tracke (OWT) comprising a spectrometer with effectively two input ports and effectively two detector arrays, and means for centering a spectral line from a reference wavelength input to the first input port onto the first detector array.

3. The combination of claim 2, further comprising first and second detector elements fcr each said detector array, and means for subtracting the outputs of said two detector elements to produce a difference signal.

4. The combination of claim 3, further comprising first servo means for effecting the centering of said spectral line from said first input port onto said first detector array, said difference signal from said first detector array controlling said first servo means.

5. The combination of claim 4, further comprising second servo means to control the wavelength altering means of said tunable light source, said difference signal from said second detector array controlling said second servo means, said tunable light source comprising a wavele rigth source for said second input port.

6. The combination of claim 5, wherein the wavelength altering means of said tunable light source produces from said tunable light source, a wavelength at a desired offset from said reference wavelength.

7. The combination of claim 6, wherein said wavelength at a desired offset comprises the reference wavelength to at least one next-in-line OWT in a concatenated array of OWTs.

8. The combination of claim 1, further comprising active-optical-element-to-extended-cavity coupling means such that the length of the portion of the resonant cavity that is not coupled to the grating is not more than substantially one-half the length of the resonant cavity.

9. The combination of claim 8, further comprising an eccentric optical fiber to receive light from said tunable light source, and means for rotating said fiber to scan over an area in a pattern of one of a spiral or overlapping circles.

10. The combination of claim 9, further comprising a rotatable plug adapted to receive said optical fiber to place its core eccentric of the fiber axis, said means for rotating causing rotation of the eccentric optical fiber to scan the area in a pattern of one of a spiral and overlapping circles.

11. The combination of claim 1, further comprising an eccentric optical fiber inserted into a rotatable eccentric plug, rotation of said plug and said rotation of said eccentric optical fiber cooperating to scan said optical fiber over an area in a pattern of one of a spiral or overlar ping circles.

12. The combination of claim 1, further comprising a first eccentric, rotatable plug adapted to receive a concentric optical fiber, said first eccentric plug being inserted into a second eccentric rotatable plug adapted to receive said first eccentric plug, rotation of at least one of said first plug and said second plug cooperating to scan said optical fiber over an area in a pattern of one on a spiral or overlapping circle.

13. The combination of claim 8, further comprsing a first eccentric, rotateble plug adapted to receive a concentric optical fiber, said first eccentric plug being inserted into a second eccentric rotatable plug adapted to receive said first eccentric plug, rotation of at least one of said first plug and said second plug cooperating to scan said optical fiber over an area in a patern of one of a spiral or overlapping circle.

14. The combination comprising:
a seiconductor laser that emits light from a face thereof;
one of an eccentric optical fiber having and end and a concentric optical fiber having an end is mounted eccentrically, said end being positioned to receive the laser light coupled thereto; and
means for positioning by rotational means said end of said optical fiber relative to scan said end over any area in a pattern of one of a spiral and overlapping circles relative to said laser face to effect coupling of the laser light output to said optical fiber.

15. The combination of claim 6, further comprising an eccentric optical fiber, and means for rotating said fiber to scan a pattern of overlapping circles.

16. The combination of claim 14, wherein said means for rotating said optical fiber comprise a rotatable eccentric plug adapted to received a concentric optical fiber, said means for positioning rotating said plug and said optical fiber cooperating to scan an area in a pattern of one of a spiral and overlapping circles.

17. The combination of claim 6, further comprising an eccentric optical fiber having an end inserted into a rotatable eccentric plug, rotation of said plug and said rotation of said eccentric optical fiber cooperating to position said end of said optical fiber to receive light from said laser.

18. The combination of claim 6, further comprising a first eccentric, rotatable plug adapted to receive an end of a concentric optical fiber, said first eccentric plug being inserted into a second eccentric rotatable plug adapted to receive said first eccentric plug, rotation of at least one of said first plug and said second plug cooperating to position said end of said optical fiber to receive light from said laser.

19. The combination of claim 7, further comprising a first eccentric, rotatable plug adapted to receive a concentric optical fiber, said first eccentric plug being inserted into. a second eccentric rotatable plug adapted to receive said first eccentric plug, rotation of at least one of said first plug and said second plug cooperating to position the end of said optical fiber.

20. Apparatus as in claim 1 wherein said semiconductor laser has:
a face that emits light;
an optical fiber having an end to which the laser light is to be coupled;
means for eccentrically mounting said end of said optical fiber; and
means for scanning by rotation said end of said optical fiber relative to said laser face over an area in a pattern of one of a spiral and overlapping circles to effect coupling of the laser light output to said optical fiber.

21. An apparatus as in claim 1 further conprising:
a segment of electro-optical material incorporated in said optical cavity and wherein said second generator drives said segment by a pulse of appropriate timing, sign and form to change its index of refraction in a direction opposite to the change of index of refraction of the composite cavity effected by a modulating pulse of drive current supplied by said first generator, and by an amount that substantially negates the change of index of refraction of the composite cavity caused by said modulating pulse.

22. A method for suppressing the effect of wavelength pulling of a semiconductor laser comprising the steps of:
supplying a drive current to said laser of a polarity to cause it to emit light; and
modelating the drive current with a signal of opposite polarity of said drive current to reduce the density of the laser inverted charge earier population and substantially quench said laser.

23. A method as in claim 20, wherein said drive current is applied as a pulse and wherein
the modulating step comprises driving said laser with a currtent pulse of a desired waveform in a direction opposite the direction of said drive current pulse to reduce the density of the inverted charge-carrier population of said laser and substantially quench said laser.

24. A method as in claim 20, wherein said modulating step comprises:
modifying the laser with a train of laser-quenching pulses of desired waveform each of which pulses is generated by a pulse generator that outputs a puilse when triggered by the leading edge of a respective pulse in a train of provided input modulation pulses.

25. A method as in claim 24, further comprising:
controlling the index of refraction of the resonant optical cavity of said laser by driving a portion of said optical cavity with a pulse train, each of wbose pulses is of a desired countervailing waveform that is synchronized with a respective pulse of said laser quenching pulse train, to keep substantially invariant the composite index of refraction of the resonant optical cavity during modulation.

26. A method as in claim 24, further comprising the step of discharging the stiay capacitance of said laser.

27. A method as in claim 24, further comprising the step of restoring laser output signals to substantially that which would have been produced in the absence of driving said laser with said quenching pulses of desired waveform.

28. A method as in claim 24, wherein the combination of said laser-quenching pulses and the laser drive current results in a net drive current for said laser that tends towards zero.

29. A method as in claim 28, wherein said combination results in a net drive current for said laser that is of a direction reverse to the drive current.

30. An apparatus for directly modulating a semiconductor laser while reducing the wavelength pulling effect comprising:
a semiconductor laser;
a first generator for supplying a drive current to said laser;

and a second generator for supplying a modulating current pulse to said laser in a direction opposite to the polarity direction of said drive current to reduce the density of the inverted charge carrier population of said laser substantially quenching said laser.

31. The combination comprising:

a semiconductor laser that emits light from a face thereof;

means for directly modulating said semiconductor laser while reducing the wavelength pulling e Efect comprising:
- a first generator for supplying a drive current to said laser;
- a second generator for supplying a modulating current pulse to said laser in a direction opposite to the polarity direction of said drive current to reduce the de isity of the inverted charge carrier population of said laser, substantially quenching said laser; and
- one of an eccentric optical fiber having an end and a concentric optical fiber having an end mounted eccentrically, said end being positioned to receive and have the emitted laser light coupled thereto; and means for positioning by rotational means said end of said optical fiber to scan said end over any area in a pattern of one of a spiral and overlapping circles relative to said laser face to effect coupling of the emitted laser light to said optical fiber.

32. The combination of claim 31 wherein said semiconductor laser is an active element in a tunable light source having an emission spectrum of substantially single lines, said tunable light source comprising:

at least one active optical element, a respective first reflective end for each said active optical element, a grating with a set of lines that are one of parallel and divergent, said divergent lines diverging from at least one of a true vertex and an effective vertex, said grating and said first reflective end of each said active optical element cooperating to form a respective laser resonant cavity that contains each said active optical element, each said active optical element and its resonant cavity cooperating to produce a respective light output having an emission spectrum of substantially a single line, said means for effecting a grazing coupling between said grating and each said laser resonant cavity anc for controlling said grazing coupling to maintain substantially uniform reflection from each grating line back to each said active element, each said laser and said resonant cavity being at least one of a resonant cavity without an optical fiber and a resonant cavity having an optical fiber, and means for moving said grating along a path relative to each said laser resonant cavity to simultaneously and in the same ratio alter both the periodicity of the effective intersections of said grating lines with each said resonant cavity and the effective cavity length of each said resonant cavity to produce a constant longitudinal mode throughout the entire tuning range of said tunable light source.

* * * * *

UNITED STATES PATENT AND TRADEMARK OFFICE
CERTIFICATE OF CORRECTION

PATENT NO. : 6,868,101 B1
DATED : March 15, 2005
INVENTOR(S) : Herman L. Lowenhar et al.

It is certified that error appears in the above-identified patent and that said Letters Patent is hereby corrected as shown below:

Title page,
Item [75], Inventors, please delete "Herman C. Lowenhar, New York, NY" and substitute -- Herman L. Lowenhar, New York, NY --.

Signed and Sealed this

Thirty-first Day of May, 2005

JON W. DUDAS
*Director of the United States Patent and Trademark Office*